United States Patent

Yao et al.

[11] Patent Number: 6,140,235
[45] Date of Patent: Oct. 31, 2000

[54] HIGH PRESSURE COPPER FILL AT LOW TEMPERATURE

[75] Inventors: Tse-Yong Yao, San Francisco; Barry Chin, Saratoga, both of Calif.

[73] Assignee: Applied Materials, Inc., Santa Clara, Calif.

[21] Appl. No.: 08/985,844

[22] Filed: Dec. 5, 1997

[51] Int. Cl.[7] .................................................. H01L 21/44
[52] U.S. Cl. ............................................. 438/679; 438/687
[58] Field of Search ..................................... 438/535, 544, 438/560, 624, 631, 635, 637, 641, 675, 679, 711, 778, 687

[56] References Cited

U.S. PATENT DOCUMENTS

| | | | |
|---|---|---|---|
| 5,011,793 | 4/1991 | Obinata | 437/203 |
| 5,186,718 | 2/1993 | Tepman et al. | 29/25.01 |
| 5,246,885 | 9/1993 | Barren et al. | 438/778 |
| 5,501,911 | 3/1996 | Ebe et al. | 428/457 |
| 5,613,296 | 3/1997 | Kurino et al. | 29/852 |
| 5,654,237 | 8/1997 | Suguro et al. | 438/624 |

FOREIGN PATENT DOCUMENTS

WO 93/08591  10/1992  WIPO .

OTHER PUBLICATIONS

D.C Butler, P.J. Holverson, Paul Rich, J. Hems, G.A. Dixit, S. Poarch, and R.H. Havemenn, "Enhanced Bottom Coverage of Sub–Micron Contact Holes Using a Novel Hi–Fill Ti/TiN Sputter Process," Oct. 4 and 6, 1994, 7 pages.

H.J. Barth, M. Frank, S. Rohl, M. Schneegans, H.Wendt, "Integration Aspects of a Hi–Fill Barrier With a High Pressure Aluminum Contact Fill," Jun. 1995, 7 pages.

David Butler, "Options for Multilevel Metallization," Mar. 1996, S7–S10 pages.

G.A. Dixit, M.F. Chisholm, M.K. Jain, T. Weaver, L.M. Ting, S. Poarch, K. Mizobuchi and R.H. Havemann, A Novel High Pressure Low Temperature Aluminum Plug Technology For Sub–0.5 $\mu$m Contact/Via Geometries, 4 pages.

P.J. Holverson, C.D. Dobson, Paul Rich, D.C. Butler, G.R. Green, M.G.M. Harris, and Arthur McGeown, "A Multilevel A1–Plug Technology For Sub–Half Micron Metallization," 7 pages.

K. Mizobuchi, K. Hamamoto, M. Utsugi, G.A. Dixit, S. Poarch, R.H. Havemann, C.D. Dobson, A.I. Jeffryes, P.J. Holverson, Paul Rich, D.C. Butler, N ick Rimmer, and Arthur McGeown, "Application of Force Fill A1–Plug technology to 64Mb DRAM and 0.35 $\mu$m Logic," 2 pages.

Z. Shterenfeld–Lavie, I. Rabinovich, J. Levy, A. Haim, "A 3–Level, 0.35 $\mu$m interconnection processing using an innovative high pressure aluminum plug technology," 7 pages.

*Primary Examiner*—David Nelms
*Assistant Examiner*—Reneé R. Berry
*Attorney, Agent, or Firm*—Thomason, Moser & Patterson

[57] ABSTRACT

The present invention provides a method and apparatus for filling submicron features on a substrate with a polycrystalline metal such as copper or a copper alloy comprising at least 90% by weight of copper. The method comprises deposition of a polycrystalline metal layer which bridges the submicron features and has a grain size smaller than the submicron features, and exposing the polycrystalline metal layer to a high pressure processing gas at a temperature less than one half of the absolute melting temperature to extrude the metal layer into the submicron features.

10 Claims, 8 Drawing Sheets

HIGH PRESSURE COPPER FILL AT LOW TEMPERATURE

FIELD OF THE INVENTION

The present invention relates to semiconductor processing techniques. More particularly, the invention relates to high pressure processing chambers and methods for filling vias and holes with metal.

BACKGROUND OF THE RELATED ART

A high pressure flow (HPF) subsystem or chamber developed for use with the ENDURA® PVD system, available from Applied Materials, Inc., is based on a materials processing technology known as "Hot Isostatic Pressing" (HIP). HIP is commonly used in applications such as powder metallurgy and diffusion bonding. During a HIP process, a material deposited on a substrate is subjected to simultaneous application of high isostatic pressure and elevated temperature. Isostatic pressure means equal pressure is applied in all directions by a pressurized processing gas. Argon gas is the most widely used processing gas. Elimination of internal defects such as voids and microporosity is achieved through plastic deformation, creep, and diffusion of the material during the HIP process. The pressure and temperature applied to a material deposited on a substrate depend on the material properties and applications. An HPF process may be applied to fill vias, contacts, and trenches with aluminum at wafer temperatures above about 300° C. and pressures between about 1,000 psi ($5.2 \div 10^4$ Torr) and about 12,000 psi ($6.2 \times 10^5$ Torr).

Via and contact fill capability and low contact resistance are essential for ultra large scale integration (ULSI) interconnect technology. As the device geometries of semiconductors continue to shrink towards the sub-quarter micron regime, it is becoming increasingly challenging to completely fill vias, contacts, and trenches of small dimensions and high aspect ratios. An HPF chamber can achieve complete fill of the vias, contacts, and trenches through application of HIP.

Prior to transferring the wafer to an HPF chamber, the wafer receives a layer of aluminum sputtered thereon at a temperature above 300° C. to achieve large grain size (~1 micron). Typical sputtering processes will form an aluminum film which bridges the via, contact, or trench, thereby creating a void within the feature. The wafer is then transferred into an HPF chamber, where it is heated above 300° C. to promote plastic deformation and exposed to high pressure Argon gas at several thousand pounds per square inch (psi). Due to the pressure difference between the inside and the outside of the voids, and the elevated temperature enhancing the flow of the material, the aluminum layer is extruded into the voids. Therefore, the via, contact, or trench holes are completely filed and a void-free metal interconnect is formed.

The design and operation of an HPF chamber is complicated by the fact that it must be compatible with both the high pressure conditions of hot isostatic pressing and the high vacuum conditions associated with integration on a cluster tool. Cluster tools are beneficial for limiting exposure of the wafer and devices being formed thereon to particulate contaminants that may be present in the clean room air. Cluster tools also provide a controlled environment in which a wafer or plurality of wafers may be processed through a number of processes and steps without exposure to the atmosphere. The cluster tool will typically have a transfer chamber through which wafers are transported from a loadlock chamber to one or more processing chambers or other cluster tools. The transfer chamber is a low particle environment maintained at a pressure of about $10^{-8}$ Torr.

An examplary process using the HPF chamber includes the steps of depositing a PVD TiN liner over a substrate having a high aspect ratio via formed therein, depositing a PVD Al layer over the TiN liner, then transferring the substrate into an HPF chamber for exposure to heat and an argon gas source at pressures between about 1,000 and about 12,000 psi.

Elemental aluminum (Al) and its alloys have been the traditional metals used to form lines and plugs in semiconductor processing because of aluminum's low resistivity, superior adhesion to silicon dioxide ($SiO_2$), ease of patterning, and high purity. However, as line widths decrease and current density increases, materials with better resistivities and better electromigration are being sought. Electromigration is a phenomenon that occurs in a metal circuit while the circuit is in operation, as opposed to a failure occurring during fabrication. Electromigration is caused by the diffusion of the metal due to the electric field set up in the circuit. The metal gets transported from one end to the other after hours of operation and eventually separates completely, causing an opening in the circuit. This problem is sometimes overcome by Cu doping and texture improvement. Electromigration is a problem that gets worse as the current density increases.

Copper and its alloys, on the other hand, have lower resistivities than aluminum and significantly higher electromigration resistance. These characteristics are important for supporting the higher current densities experienced at high levels of integration and increased device speed. However, the primary problems with integrating copper metal into multilevel metallization systems are (1) the difficulty of patterning the metal using etching techniques, (2) the inherent difficulty in filling small vias using conventional PVD processes, and (3) the difficulty in flowing copper by purely thermal processes.

For devices of submicron minimum feature size, wet etch techniques for copper patterning have not been acceptable due to liquid surface tension, isotropic etch profile, and difficulty in over-etch control. A reliable dry etch process is not well developed.

As feature sizes decrease and aspect ratios of features increase, PVD processes have increasing difficulty in achieving good aperture filling or step coverage. Physical sputtering of target material results in target atoms traveling at acute angles relative to the substrate surface. As a result, where high aspect ratio apertures are being filled, sputtered atoms tend to deposit on the upper wall surfaces and bridge the opening thereof before the aperture is completely filled with deposition material. The resulting structure typically includes voids therein which compromise the integrity of the devices formed on the substrate.

Filling of vias, holes, and trenches with copper by HIP is prohibited by the high melting point of copper, which is 1085° C. (1358° K.), and by the low bulk diffusivity of copper. The surface diffusivity of copper is substantially greater than the bulk diffusivity, however bridging across the feature occurs very easily at the high temperatures. HIP processes rely on thermally activated "creep" type plastic deformation of copper which requires an excessively high temperature that would damage underlying layers on the substrate. Without high temperature plastic deformation at a temperature substantially greater than one-half of the melting temperature (°K.), it is expected that a deposited metal layer would not completely fill the submicron features.

SUMMARY OF THE INVENTION

The present invention provides a high pressure method for filling submicron features on semiconductor substrates with a polycrystalline metal or metal alloy, the method comprising the steps of depositing a polycrystalline metal layer which bridges the submicron features on the substrate, the polycrystalline metal layer having a grain size smaller than the submicron features, and exposing the polycrystalline metal layer at a temperature less than one-half the absolute melting temperature of the metal layer to a processing gas at a pressure greater than about 1,000 pounds per square inch (psi). Preferably, the polycrystalline metal layer has a crystal orientation that is not a most densely packed orientation. Due to the pressure difference between the processing gas and voids within the bridged features, the polycrystalline metal layer is extruded by cold isostatic pressing (CIP) into the submicron features. This method is particularly useful where a HPF processing chamber and a copper deposition chamber are combined in a cluster tool for processing multiple substrates.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
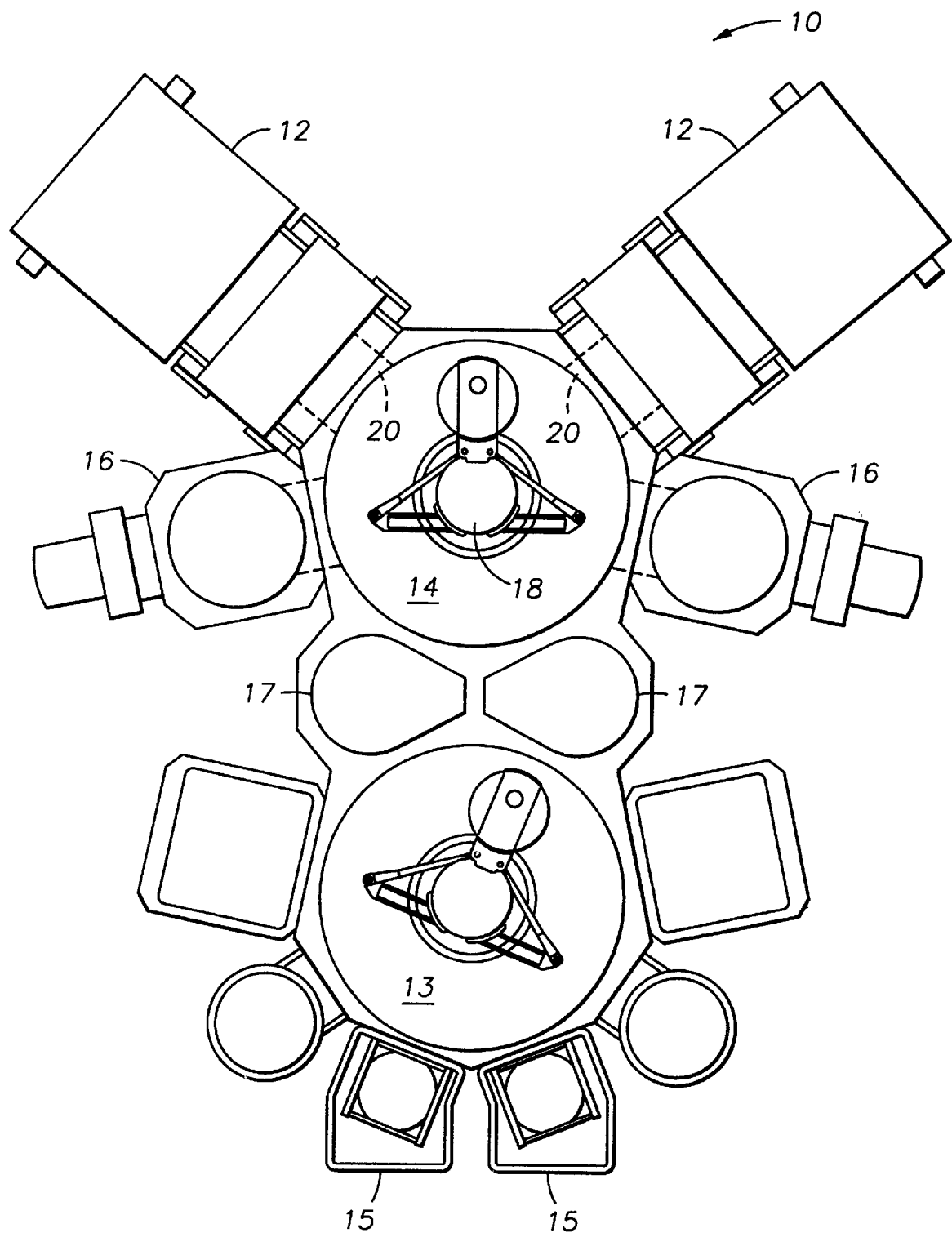
Figure 2:
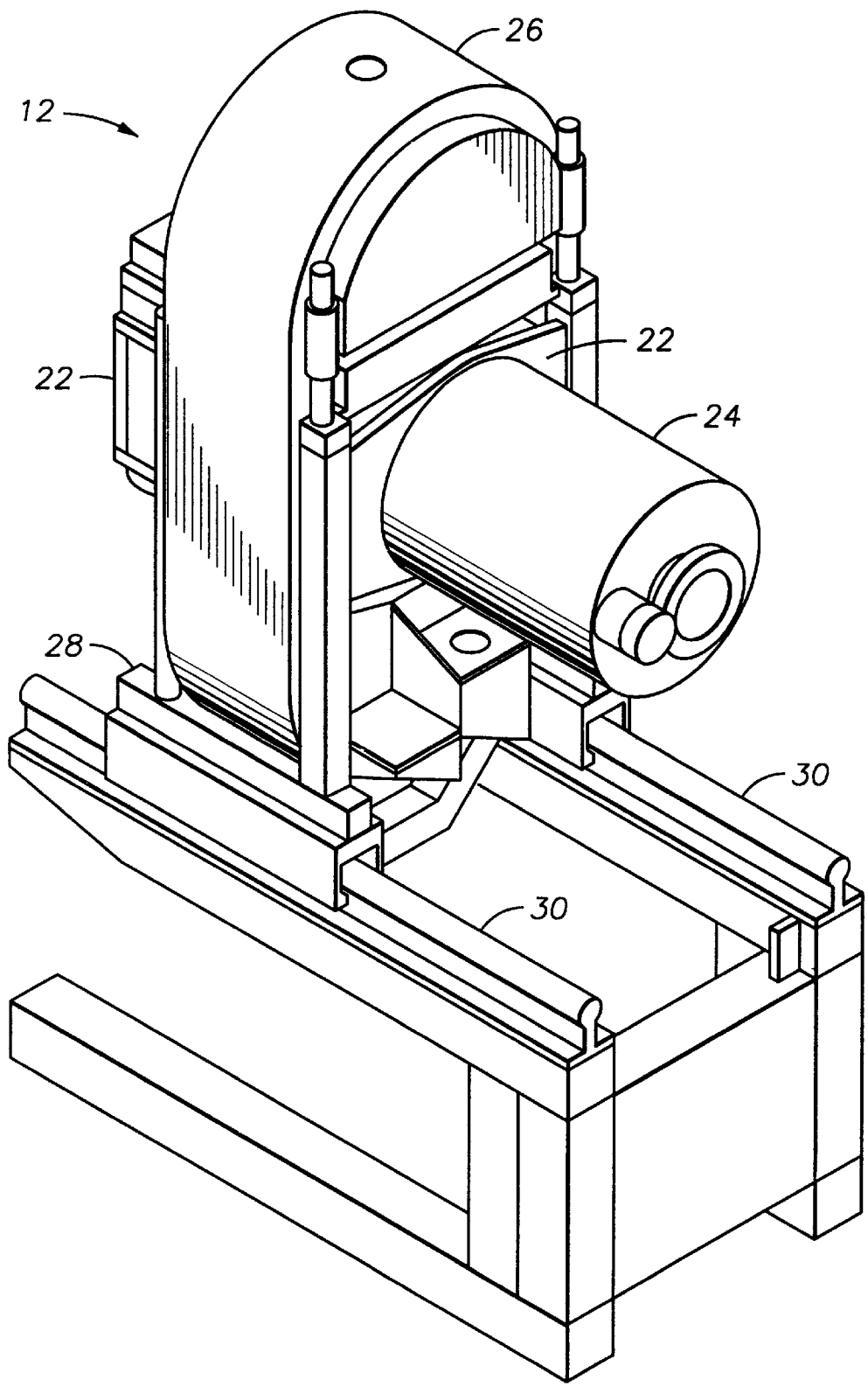
Figure 3:
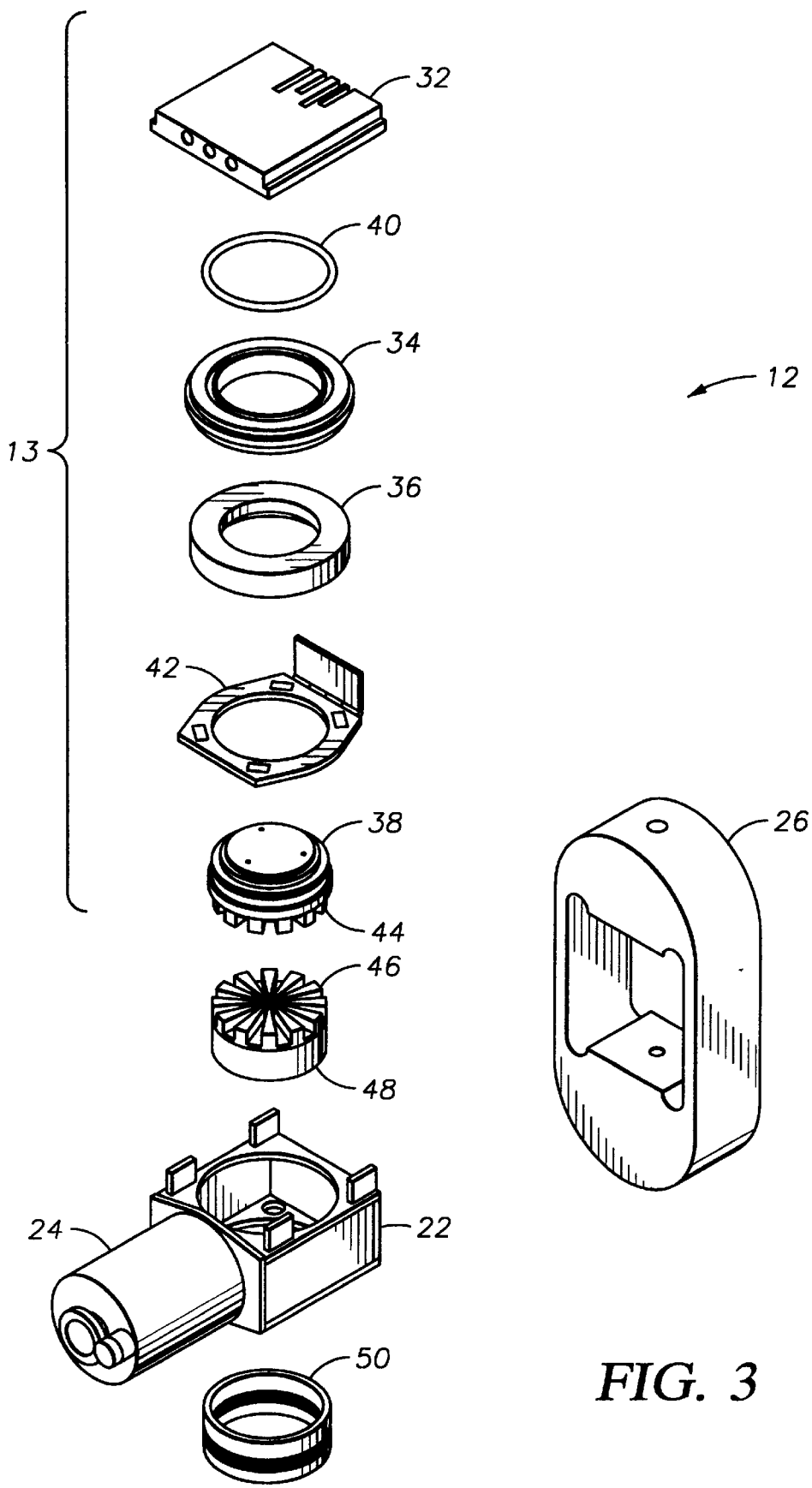
Figure 4:
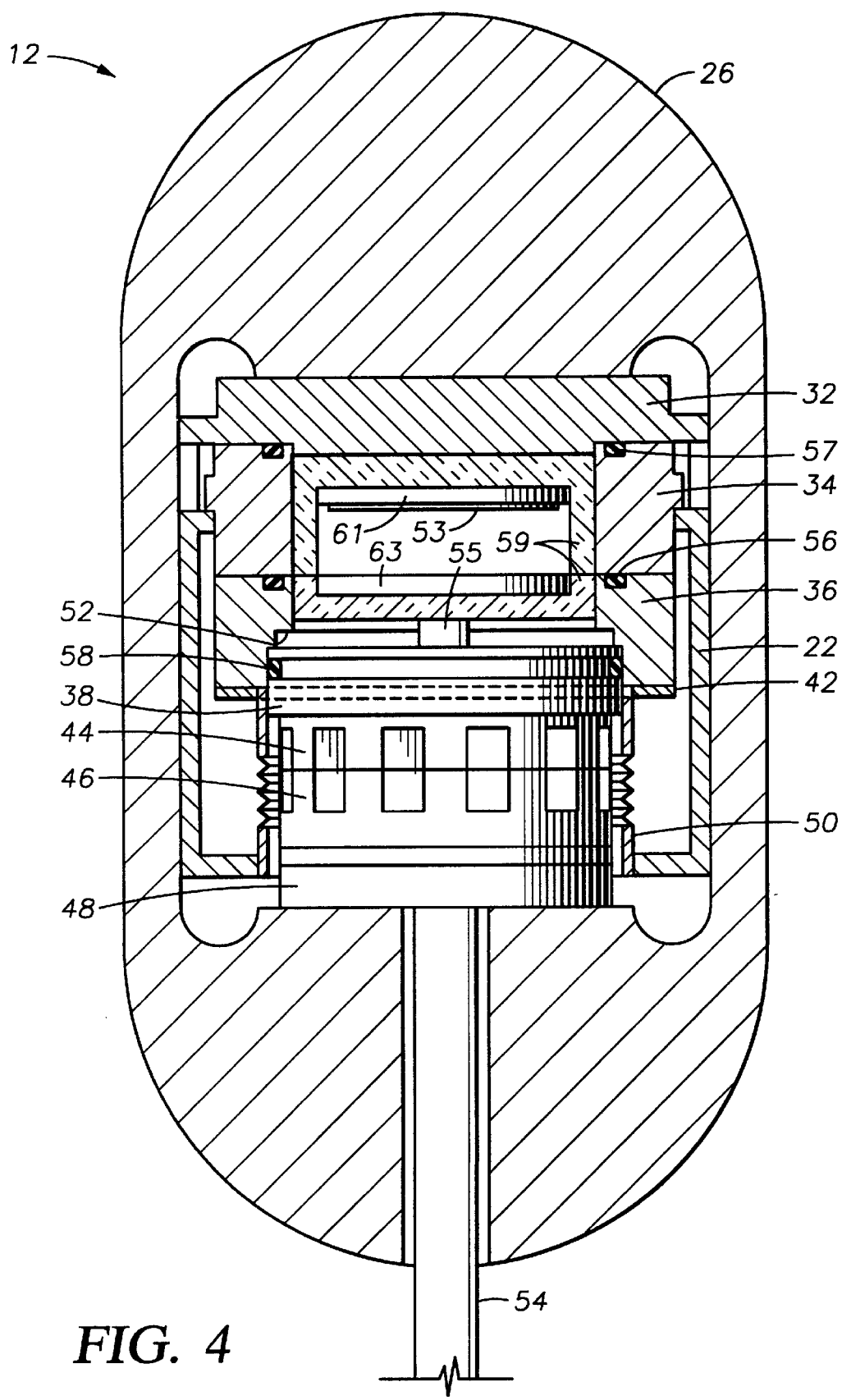
Figure 5:
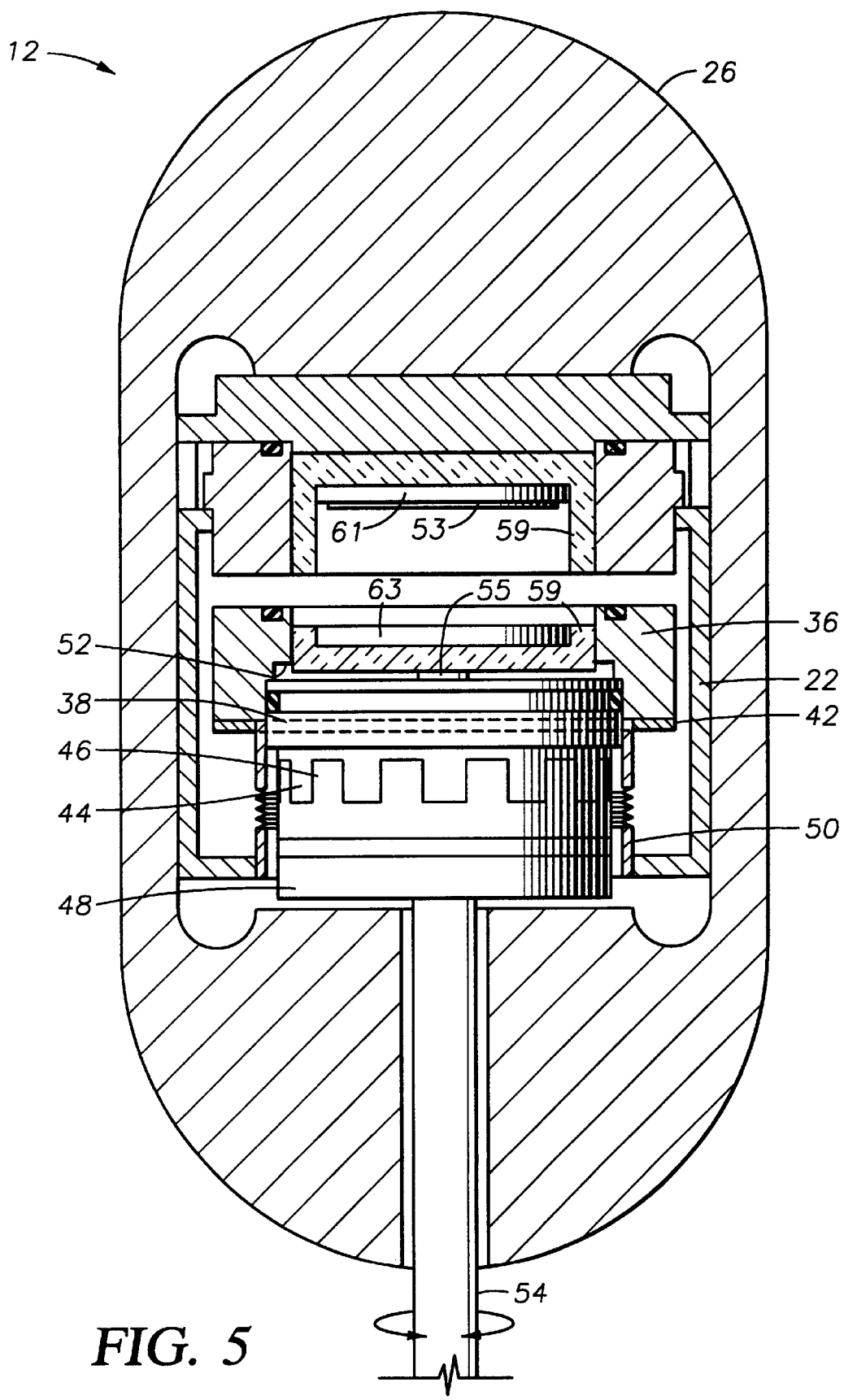
Figure 6:
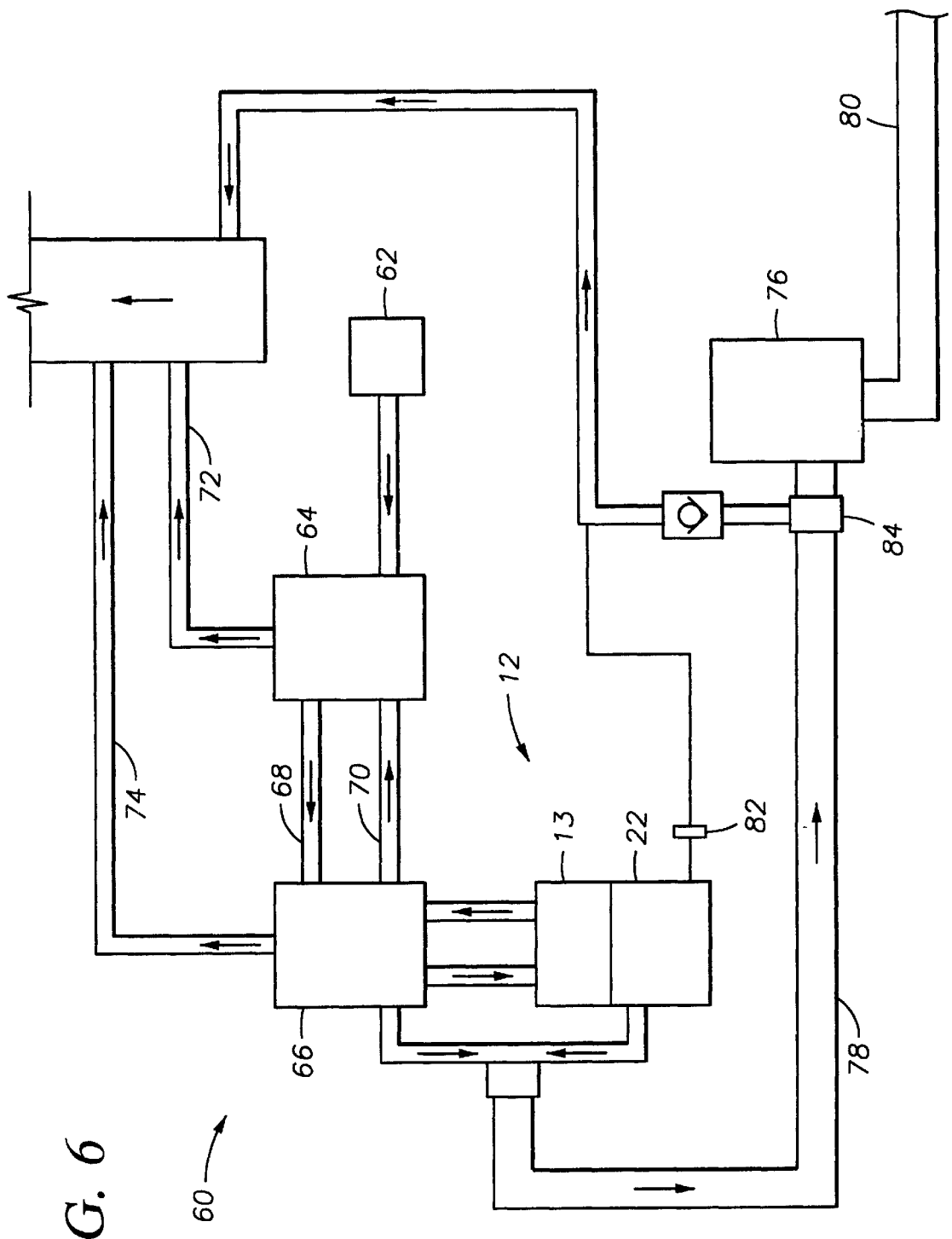

The above and other advantages of the present invention are described in conjunction with the following drawing figures, in which:

FIG. 1 is a plan view of a preferred cluster tool including two HPF chambers;

FIG. 2 is a perspective view of a preferred HPF chamber;

FIG. 3 is an exploded view of the HPF chamber of FIG. 2;

FIG. 4 is a cross-sectional view of the HPF chamber of FIG. 2 in high pressure operation;

FIG. 5 is a cross-sectional view of the HPF chamber of FIG. 2 in vacuum operation; and FIG. 6 is a schematic flow diagram of the gases communicating with the HPF chamber.

Figure 7:
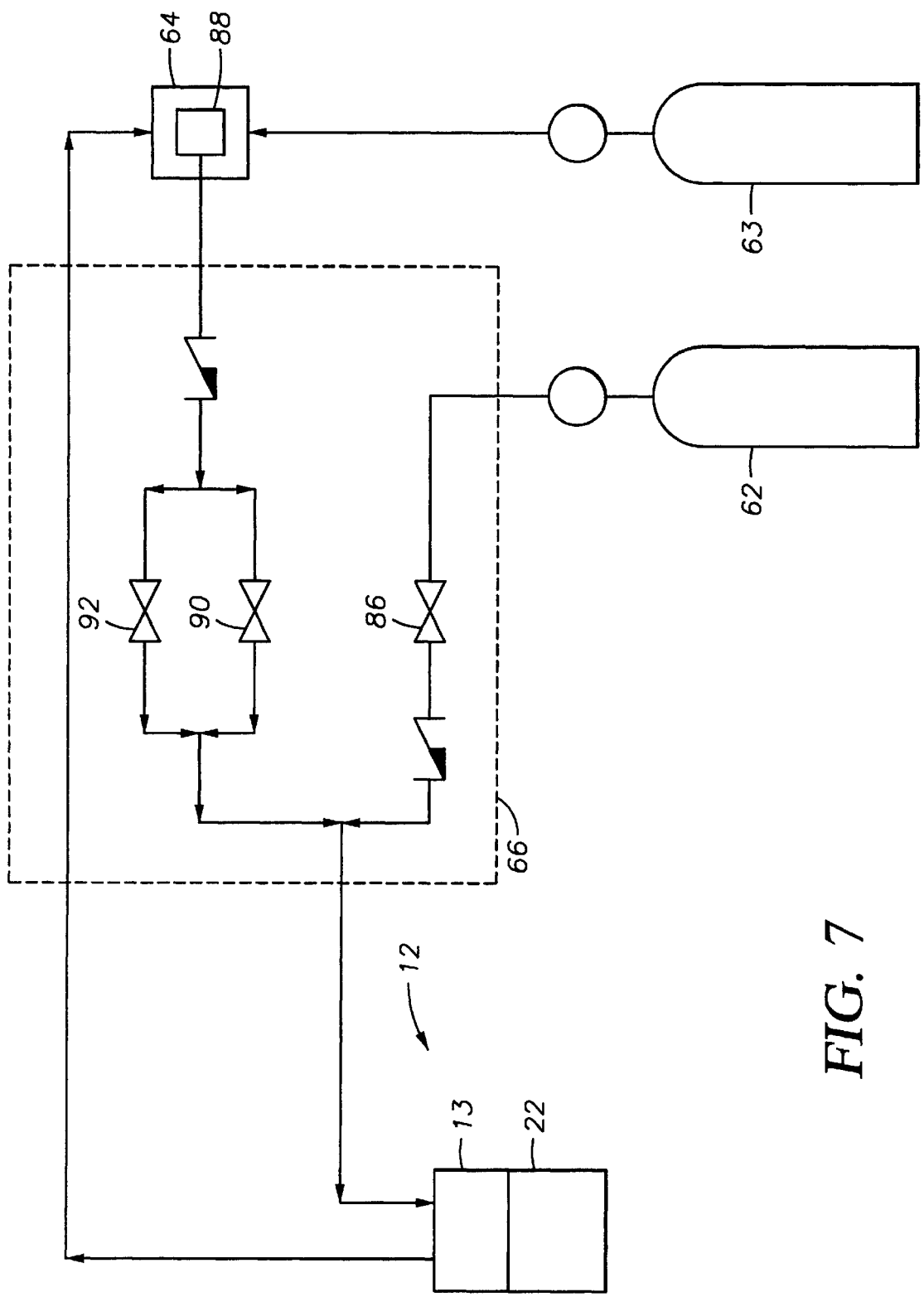

FIG. 7 is a flow diagram of a valve box which provides gas from a low pressure gas source to the pressure vessel of the HPF chamber at various pressures.

Figure 8:
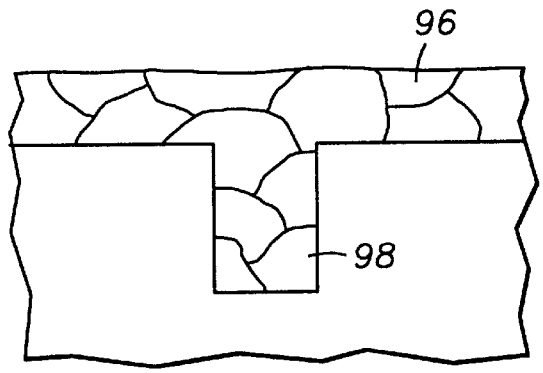

FIG. 8 shows a submicron trench in a dielectric layer filled with a copper layer having a grain size smaller than the submicron trench.

Figure 9A:
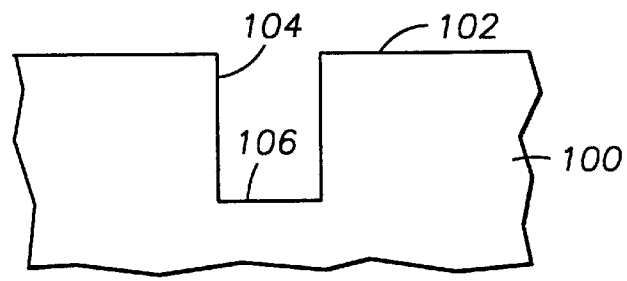
Figure 9B:
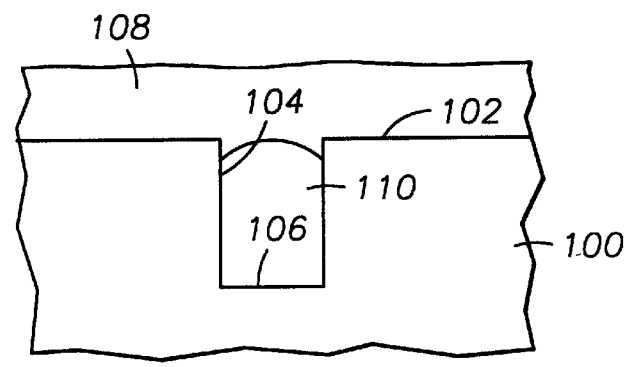
Figure 9C:
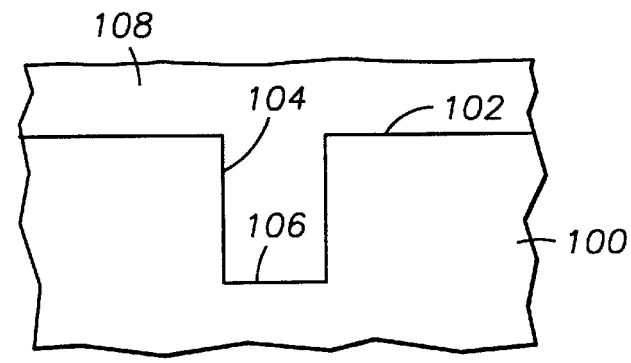

FIGS. 9A–9C show a method of filling a trench with copper according to the present invention.

DETAILED DESCRIPTION OF THE PREFERRED EMBODIMENT

The present invention provides a method and apparatus for filling submicron features on a substrate with a polycrystalline metal. The method comprises deposition of a polycrystalline metal layer at low temperature to provide a grain size smaller than the feature size and a crystal orientation that is not a most densely packed orientation. The polycrystalline metal layer bridges the submicron features leaving voids in the features. The voids are filled by exposing the polycrystalline metal layer to a high pressure processing gas at a temperature less than one half of the absolute melting temperature to extrude the metal layer into the submicron features. Suitable polycrystalline metal layers include copper and copper alloys having at least 90% by weight of copper. The absolute melting temperature of copper is 1358° K. (1085° C.), thus, cold isostatic pressing (CIP) of the copper layer occurs at a substrate temperature below about 679° K. (406° C.).

FIG. 1 is a plan view of a preferred cluster tool 10 including two HPF chambers 12 in communication with the transfer chamber 14 which is maintained under a vacuum, typically about $10^{-8}$ torr. It is preferred that the transfer chamber 14 also communicate with one or more PVD process chambers 16 for deposition of metal films over the wafer just prior to being processed in an HPF chamber 12. The transfer chamber 14 communicates with cool down chambers 17 which receive wafers from a buffer chamber 13. Wafer loading and unloading is provided by load lock chambers 15 which communicate with the buffer chamber 13. Additional wafer processing, such as wafer orientation, wafer degassing, deposition of barrier layers, and deposition of protective coatings are provided by chambers which communicate with the buffer chamber 13.

The wafers are typically transferred from one chamber to the next by a robot assembly 18 which passes the wafers through slit valves 20 which isolate each process chamber 12,16 from the transfer chamber 14. Methods and apparatus for accomplishing these transfer operations are described in U.S. Pat. No. 5,186,718 which is incorporated herein by reference.

FIG. 2 is a perspective view of a preferred HPF chamber 12. The chamber 12 is shown including vacuum chamber housing 22, a yoke 26 encircling the vacuum chamber housing 22, and a trolley or carriage 28 for the yoke 26. The carriage 28 is coupled to and supports the yoke 26 and includes rollers that engage a pair of rails 30 to allow movement of the yoke 26 away from the vacuum chamber housing 22. It is only necessary to move the yoke 26 to access the chamber 22 for maintenance.

FIG. 3 is an exploded view of the HPF chamber 12 of FIGS. 1 and 2. The vacuum chamber housing 22 is designed to contain a pressure vessel 13 therein. The pressure vessel 13 is then restrained by the inner walls of the large external yoke 26. A preferred pressure vessel comprises four major pieces: an upper plug 32, an upper ring 34, a lower ring 36, and a lower plug 38. The pressure vessel 13 may also include various sealing members, such as slip washer 40 and a seal (not shown) between the upper ring 34 and lower ring 36.

The lower plug 38 has an outer surface with one or more fingers 44 that are engageable with one or more fingers 46 on an opposing finger plate 48. The finger plate 48 is coupled to an actuator (not shown) from below in order to rotate the finger plate 48 clockwise and counter-clockwise between two positions. In a first position, the downwardly depending fingers 44 of the lower plug 38 are allowed to intermesh with the upwardly depending fingers 46 of the finger plate 48. In a second position, the fingers 44, 46 are aligned in face-to-face contact. The first position is used when the pressure vessel 13 is open and the second position is used when the pressure vessel 13 is closed.

The vacuum chamber 22 may be formed around the pressure vessel in many ways, such as wholly encompassing the pressure vessel or sharing one or more walls. However, in the preferred embodiment shown in FIG. 3, the upper plate 32 and upper ring 34 form not only the top portion of the pressure vessel 13, but also the top wall of the vacuum chamber housing 22. This arrangement provides simple construction and minimizes the size of the apparatus. Besides the benefit of minimizing the HPF chamber footprint, this arrangement minimizes the gas-containing volume of the vacuum chamber 22. Similarly, it is desirable to minimize the gas-containing volume of the pressure vessel 13.

A preferred bellows assembly 50 has a first rigid ring that is coupled to the bottom wall of the vacuum chamber 22, a second rigid ring coupled to the lower plug 38 and a flexible material extending therebetween. The bellows assembly 50 allows the lower plug 38 to move up and down without breaking the seal on the vacuum chamber 22.

FIG. 4 is a schematic cross-sectional view of the HPF chamber 12 of FIGS. 2 and 3 in high pressure operation. The upper plug 32 and upper ring 34 are preferably stationary, with the upper plug resting against the yoke 26. The lower ring 36 is pressed upward against the upper ring 34 to form a face-to-face seal. The lower ring 36 is preferably raised by an actuator 54 or other mechanical means for raising it into position. Since pressurized gases apply an even pressure in directions perpendicular to the surfaces that they contact, a surface 52 receives an upward force that is substantially unopposed. In this manner, the pressure vessel 13 is held closed under its own pressure.

Similarly, an actuator (not shown) and internal pressure forces the lower plug 38 downward against the finger plate 48 which abuts the bottom face of the yoke 26. The fingers 44 of the lower plug 38 and the fingers 46 of the finger plate 48 are shown in alignment with the fingers stacked. In this alignment, the pressure vessel is locked and the wafer 53 may be processed.

The pressure vessel is provided with three main seals. A spring loaded face seal 56 is most preferred between the upper ring 34 and lower ring 36. A spring loaded lip seal 57 with a backup ring is most preferred between the upper plug 32 and the upper ring 34. Another lip seal 58, with a backup ring, is preferred for sealing between the lower plug 38 and the lower ring 36.

The pressure vessel further includes a heater, preferably a pair of disc-shaped heaters 61, 63 located within insulation 59 along the internal walls of the upper ring 34 and the lower ring plug 38 in order to facilitate the HIP process. The insulation 59 is used between the heaters 61, 63 and the vessel walls to keep the vessel walls and seals from overheating. It is preferred that the gap between the upper heater 61 and the wafer 53 be no more than a fraction of an inch and that the upper heater be used as the primary source of heat to the wafer. The heater feed throughs (not shown) extend through the upper plug 32.

In order to open the pressure vessel 13, it is first depressurized through a high pressure gas line, and then evacuated by a roughing pump. Since the bottom of the lower plug 38 is at atmosphere and the top is in vacuum, the lower plug is lifted up due to the pressure difference. With the lower plug lifted, the finger plate may be rotated to unlock the pressure vessel and allow the wafer to be removed from the HPF chamber.

It is preferred that the HPF chamber include a blast plate and door 42 coupled to the lower plug 38 that will move up and down along with the blast plate and door 42. When the lower plug 38 is moved upward so that the pressure vessel is closed and pressurized, the door portion of the blast plate 42 covers the slit valve opening in the side of the vacuum chamber 22. In this manner, the slit valve is protected in the event of a catastrophic failure of the pressure vessel. It is also preferred that the vacuum chamber 22 be designed with sufficient strength to contain a catastrophic failure of the pressure vessel.

The inner surfaces of the yoke 26 contact the pressure vessel on the outer surface of the upper plug 32 and the vacuum chamber 22. The yoke is used to contain the load from the pressure vessel during pressurization. When the system is pressurized, high pressure gas forces the upper and lower plugs against the yoke, transferring the load to the yoke. Preferably, the yoke is one piece with subassemblies including lift cylinders for the lower plug, lift cylinders for the lower ring assist, and a water cooling jacket.

FIG. 5 is a schematic cross-sectional view of the HPF chamber 12 of FIGS. 2 and 3 in vacuum operation. The upper ring 34 and lower ring 36 separate under the vacuum. A robot blade 37 may then enter the pressure vessel through a slit valve (not shown) to unload a processed wafer 39 and load a subsequent wafer. To place the wafer 39 on the robot blade 37, the lower plug 38 and the lower ring 36 are lowered further by retracting the actuator 54.

FIG. 6 is a schematic flow diagram 60 of the gases communicating with the HPF chamber 12 comprising the pressure vessel 13 and the vacuum chamber 22. Argon is the preferred processing gas due to its inert chemical activity, extremely low solubility in solids, low cost and availability. An argon supply 62 of very high purity is crucial to prevent contamination of the wafers.

A compressor 64, preferably a four stage compressor, is used to take the argon supply at 65 psi and pressurize it up to about 22,500 psi. The compressor 64 then feeds the high pressure argon gas to the valve box 66 mounted above the HPF chamber assembly 12. The valve box 66 communicates with the compressor through a high pressure argon supply line 68 and a return line 70 and also communicates with a vent line 72 to the roof of the facility. The return line 70 from the valve box 66 to the compressor 64 allow a portion of the used argon gas to be recycled and filtered which in turn reduces operating costs. The valve box 66 preferably also includes it own vent line 74 which is used when the pressure vessel 13 is depressurized.

The vacuum system includes a vacuum pump 76 which draws gas from the HPF chamber 12, through the vacuum chamber 22, through a vacuum line 78 and out an exhaust line 80. The vacuum chamber 22 is protected from over pressurization by a relief valve or rupture disc 82 communicating directly with the chamber 22. Additional protection of the chamber 22 and the vacuum pump 76 may be provided by a secondary relief valve 84.

FIG. 7 is a flow diagram of the valve box 66 which provides gas from a low pressure gas source 63 to the pressure vessel 13 at various pressures. A low pressure, low flow rate gas is provided from the gas source 62 through a fine metering valve 86. In one embodiment, the valve box 66 will operate in this condition for a fixed period of time. Then valve 86 is closed and a high pressure gas is provided from a high pressure accumulator 88 coupled to the compressor 64 at a low flow rate through a fine metering valve 90. After another period of time or until reaching a certain condition, such as pressure within the pressure vessel 13, the fine metering valve 92 is also opened so that the flow rate of gas is increased. It should be recognized that other valve arrangements may be designed which will also accomplish pressurization of the HPF chamber.

Process Description

Filling of submicron features such as vias, trenches, and contact holes with a polycrystalline metal, such as a copper alloy comprising at least 90% by weight of copper, is surprisingly achieved at a temperature less than one half of the absolute melting temperature of the metal layer, such as less than about 679° K. (406° C.) which is one-half of the absolute melting temperature of copper. Studies by Applicants indicate that a grain size smaller than the submicron feature size can enhance plastic deformation of copper, thus improving filling of the features. As shown in FIG. 8, a copper layer 96 having a grain size of about 0.3 microns will fill vias, holes, or trenches 98 having a width of 0.5 microns. The studies further indicate that the deformation mechanism for the copper layers involves diffusion along grain boundaries since filling of submicron features at low temperatures improves as grain size decreases. In contrast, the deformation mechanism for aluminum appears to be creep type dislocation through a single crystal which is mostly thermally activated.

A copper layer, or other polycrystalline metal layer, having a crystal orientation that is not a most densely packed orientation, may fill more easily through a single crystal deformation mechanism which is not thermally activated. Non-thermal mechanisms include dislocation glide type deformation. In comparison, deformation of aluminum relies on thermally activated crystal deformation such as dislocation climb. The most dense crystal orientation for copper is <111> and a less dense orientation is <200>. Preferably, the crystal orientation of the deposited copper layer has less <111> orientation than <200> orientation.

Referring to FIG. 9A, to fill a submicron feature in accordance with the present invention, a dielectric layer 100 is formed by conventional techniques on a substrate. Any dielectric material, whether presently known or yet to be discovered, may be used and is within the scope of the present invention. The dielectric layer may be deposited on any suitable deposition enhancing material, but the preferred deposition enhancing materials include conductive metals and doped silicon.

Once deposited, the dielectric layer 100 is etched to form a patterned surface 102 which includes a trench having a sidewall 104 and a floor 106 which could be an underlying conductive or semi-conductive layer. The trench will typically have a high aspect ratio with steep sidewalls 104. Etching of the dielectric layer 100 may be accomplished with any dielectric etching process, including plasma etching. Specific techniques for etching silicon dioxide and organic materials may include such compounds as buffered hydrofluoric acid and acetone or EKC, respectively. However, patterning may be accomplished using any method known in the art.

In each aspect of the present invention, a barrier layer is optionally deposited on exposed surfaces including surfaces within the trench 104, 106. According to the present invention, barrier/wetting layers include such layers as a refractory tungsten (W), tungsten nitride (WN), niobium (Nb), aluminum silicates, tantalum (Ta), tantalum nitride (TaN), titanium nitride (TiN), PVD Ti/N$_2$-stuffed, a ternary compound (such as TiSiN, WSiN, etc.) or a combination of these layers. The barrier/wetting layer is deposited to form a substantially continuous cap over the dielectric layer and may be treated with nitrogen. Alternatively, exposed surfaces of silicon oxide can be treated with nitrogen to form a Si$_x$O$_y$N$_z$ layer that is effective as a barrier layer for copper.

In one embodiment of the invention, as further shown in FIG. 9B, the trench is partially filled with PVD Cu at about room temperature. After deposition, a copper layer 108 having a grain size smaller than the feature size bridges the trench leaving a void 110.

Referring to FIG. 9C, the copper layer 108 is extruded to fill the void 110 by exposing the copper layer to a pressure of at least 1000 psi at a temperature less than about 679° K. (406° C.) which is one half of the absolute melting temperature of copper. The top of the copper layer may then be planarized, preferably by chemical mechanical polishing (CMP) which can be accomplished using a Mirra™ System available from Applied Materials, Inc., Santa Clara, Calif. During the planarization process, portions of the copper layer 108, any barrier material, and dielectric 102 may be removed.

Hypothetical Example

An experimental HPF chamber is installed on an ENDURA® PVD system (available from Applied Materials, Inc., Santa Clara, Calif.) in accordance with FIG. 1. A patterned wafer having submicron features is processed in accordance with a standard PVD copper deposition process at a vacuum pressure of about 4 mTorr at about 25° C. The deposited copper layer has a thickness of about 1 micron, a grain size of about 0.1 micron, and a crystal orientation having more <200> orientation than <111> orientation. The copper layer bridges submicron features such as vias and contact holes. The wafer is transferred to the HPF chamber which is then slowly pressurized to about 20,000 psi to extrude the copper layer into the submicron features at about 400° C. for about 30 minutes.

While the foregoing is directed to the preferred embodiment of the present invention, other and further embodiments of the invention may be devised without departing from the basic scope thereof, and the scope thereof is determined by the claims which follow.

What is claimed is:

1. A method for filling submicron features on semiconductor substrates, the method comprising:

depositing a polycrystalline metal layer onto a substrate which comprises submicron features, the polycrystalline metal layer having a grain size smaller than the submicron features; and exposing the polycrystalline metal layer, while maintained at a temperature less than about one half of the absolute melting temperature of the polycrystalline metal layer, to a processing gas at a pressure greater than about 1,000 pounds per square inch.

2. The method of claim 1, wherein the polycrystalline metal layer comprises at least 99% by weight of copper and is deposited at about room temperature.

3. The method of claim 1, wherein the processing gas is argon.

4. The method of claim 1, wherein the polycrystalline metal layer is deposited by physical vapor deposition and has a crystal orientation other than a most densely packed orientation.

5. The method of claim 1, wherein the polycrystalline metal layer is exposed to the processing gas at a temperature of about 400° C.

6. A method for filling submicron features on semiconductor substrates with a metal comprising copper, the method comprising:

depositing a metal layer at about room temperature onto a substrate which comprises submicron features, wherein the metal layer comprises:

a grain size smaller than the submicron features;

a crystal orientation other than a most densely packed orientation; and at least 99% by weight of copper; and exposing the metal layer, while maintained at a temperature less than 406° C. (679° K.), to a processing gas at a pressure of about 20,000 pounds per square inch.

7. The method of claim 6, wherein the processing gas is argon.

8. The method of claim 6, wherein the metal layer is deposited by physical vapor deposition and has less than <111> crystal orientation than <200> crystal orientation.

9. The method of claim 6, wherein the metal layer is exposed to the processing gas while the metal layer is maintained at a temperature of about 400° C.

10. The method of claim 6, wherein the metal layer completely fills the submicron features on the substrate.

* * * * *

UNITED STATES PATENT AND TRADEMARK OFFICE
CERTIFICATE OF CORRECTION

PATENT NO. : 6,140,235

DATED : October 31, 2000

INVENTOR(S) : Yao et al.

It is certified that error appears in the above-identified patent and that said Letters Patent is hereby corrected as shown below:

In column 1, line 29, please replace "$(5.2 \div 10^4\ Torr)$" with "$(5.2 \times 10^4\ Torr)$".

Signed and Sealed this

Eighth Day of May, 2001

Attest:

NICHOLAS P. GODICI

*Attesting Officer*   Acting Director of the United States Patent and Trademark Office